(12) United States Patent
Miyazaki (10) Patent No.: US 7,804,578 B2
(45) Date of Patent: Sep. 28, 2010

(54) EXPOSURE APPARATUS AND DEVICE MANUFACTURING METHOD

(75) Inventor: Kyoichi Miyazaki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 360 days.

(21) Appl. No.: 11/558,148

(22) Filed: Nov. 9, 2006

(65) Prior Publication Data
US 2007/0115444 A1    May 24, 2007

(30) Foreign Application Priority Data
Nov. 18, 2005 (JP) ............................. 2005-334464

(51) Int. Cl.
*G03B 27/42* (2006.01)
(52) U.S. Cl. .......................................... 355/53; 355/30
(58) Field of Classification Search ................... 355/30, 355/53, 67, 68, 69, 71
See application file for complete search history.

(56) References Cited

U.S. PATENT DOCUMENTS

| | | | | |
|---|---|---|---|---|
| 5,877,843 | A * | 3/1999 | Takagi et al. ................... 355/30 |
| 6,359,678 | B1 * | 3/2002 | Ota .............................. 355/53 |
| 6,630,984 | B2 | 10/2003 | Bisschops | |
| 6,982,782 | B2 | 1/2006 | Emoto ........................ 355/53 |
| 2002/0027644 | A1 | 3/2002 | Bisschops ................... 355/30 |
| 2004/0004436 | A1 * | 1/2004 | Yoneda ....................... 313/512 |
| 2004/0100623 | A1 * | 5/2004 | Bisschops .................... 355/53 |
| 2004/0179178 | A1 | 9/2004 | Emoto ........................ 355/53 |
| 2005/0110968 | A1 * | 5/2005 | Aichi et al. .................. 355/30 |
| 2005/0280790 | A1 * | 12/2005 | Emoto ........................ 355/53 |

FOREIGN PATENT DOCUMENTS

EP    1 491 955 A1    12/2004
JP    2002-124461    4/2002

OTHER PUBLICATIONS

European Search Report dated Nov. 2, 2009, mailed in a Communication dated Nov. 10, 2009, in copending European patent application No. EP 06 02 3556.

* cited by examiner

*Primary Examiner*—Edward J Glick
*Assistant Examiner*—Mesfin T Asfaw
(74) *Attorney, Agent, or Firm*—Fitzpatrick, Cella, Harper & Scinto (57) ABSTRACT

An exposure apparatus that exposes a substrate to a pattern of an original. An illumination optical system illuminates the original. A projection optical system projects the pattern that is illuminated by the illumination optical system onto the substrate. A vacuum chamber houses at least one of the illumination optical system and the projection optical system. A heat absorber, arranged in the vacuum chamber, absorbs heat in the vacuum chamber. A heat conductor includes a metal member and connects the heat absorber and a wall of the vacuum chamber. The metal member is softer than the heat absorber and the wall, and fills a space between the heat absorber and the wall, and a cooler, arranged outside the vacuum chamber, cools the wall.

8 Claims, 7 Drawing Sheets

EXPOSURE APPARATUS AND DEVICE MANUFACTURING METHOD

This application claims the benefit of Japanese Patent Application No. 2005-334464, filed Nov. 18, 2005, which is hereby incorporated by reference herein in its entirety.

BACKGROUND OF THE INVENTION

1. Field of the Invention

The present invention relates to technology that exposes an object, such as a monocrystal substrate for a semiconductor wafer, or a glass substrate for a liquid crystal display (LCD) using, for example, light in the extreme ultraviolet range of 200 nm to 10 nm, or in the X-ray range.

2. Description of the Related Art

Conventionally, when manufacturing a minute semiconductor device, such as a logical circuit or a semiconductor memory using photolithography (exposure) technology, a reduction projection exposure apparatus is used that projects and transfers a circuit pattern formed on a reticle or a mask (hereafter, referred to as "an original") onto a wafer, or the like, through a projection optical system.

With this reduction projection exposure apparatus, the smallest size (resolution) that can be transferred is in proportion to the wavelength of the light used for exposure, and is in inverse proportion to the numerical aperture (NA) of the projection optical system. Accordingly, as the wavelength becomes shorter, the resolution increases. For this reason, the wavelengths of exposure light have become increasingly shorter, in response to demands for more minute semiconductor devices, in recent years. Thus, the wavelengths of ultraviolet light that are used are becoming shorter, such as light of an extra-high pressure mercury lamp (i-ray (wavelength approximately 365 nm)), a KrF excimer laser (wavelength approximately 248 nm), and an ArF excimer laser (wavelength approximately 193 nm).

However, the minuteness of semiconductor devices is increasing at a rapid pace, and there is a limit to the manufacture thereof with lithography using ultraviolet light. Therefore, in order to efficiently transfer an extremely minute circuit pattern of 0.1 µm or below, EUV exposure apparatuses are being developed that use light in an extreme ultraviolet region of wavelengths, in the range of about 10 to 15 nm, which are shorter than ultraviolet light wavelengths.

Since the absorption of light by substances becomes extremely large along with the shortening of exposure light wavelengths, it is difficult to use a refractive element, i.e., a lens, which utilizes refraction of light that can be used with visible light or ultraviolet light. Further, no glass exists that can be used in the wavelength region of EUV light, and, therefore, a refraction optical system is used that forms an optical system with only reflector elements, i.e., mirror members (for example, multilayer mirrors), that utilize light reflection.

A mirror member does not reflect all of the exposure light, and absorbs 30% or more of the exposure light. The absorbed exposure light turns into partial heat and deforms the surface shape of the mirror to cause a deterioration in the optical performance (particularly, image formation performance) thereof. Consequently, the mirrors are made of low thermal expansion glass with a small coefficient of linear expansion, such as, for example, a coefficient of linear expansion of 10 ppb, in order to reduce changes in the mirror shape caused by temperature changes.

Zerodur™ (manufactured by SHOTT) is a typical example of the low thermal expansion glass described above. In the case of Zerodur™, a temperature (zero crossing temperature) exists at which the coefficient of thermal expansion thereof becomes zero at about room temperature, and thus, it is considered that Zerodur™ can be used at about that temperature.

Since an EUV exposure apparatus is used for exposure of circuit patterns of 0.1 µm or less, the accuracy of a line-width is extremely critical, and only a deformation of about 0.1 nm or less is allowed in the surface shape of the mirror. Accordingly, even if the coefficient of linear expansion of the mirror is 10 ppb, the temperature gradually rises, and the shape of the mirror surface changes. For example, assuming the thickness of the mirror to be 50 mm, the shape of the mirror surface will change by 0.1 nm as the result of a temperature increase of 0.2° C.

To overcome this problem, because the EUV exposure apparatus is disposed in a vacuum, various methods have been proposed, such as a method involving heat transfer or radiation from a cooling plate that is provided so as to surround the mirrors of the optical system.

However, the heat generated by an EUV exposure apparatus is not just exposure heat. Typical heat sources are a vacuum pump that is attached to the vacuum chamber (external heat with respect to the vacuum chamber), or a sensor or actuator that is disposed inside an illumination optical system or a projection optical system, or the like (internal heat with respect to the vacuum chamber).

Japanese Patent Application Laid-Open No. 2002-124461 proposes a method for solving this problem.

The method disclosed in the aforementioned Japanese Patent Application Laid-Open No. 2002-124461 will now be described using FIG. 5.

Figure 5:
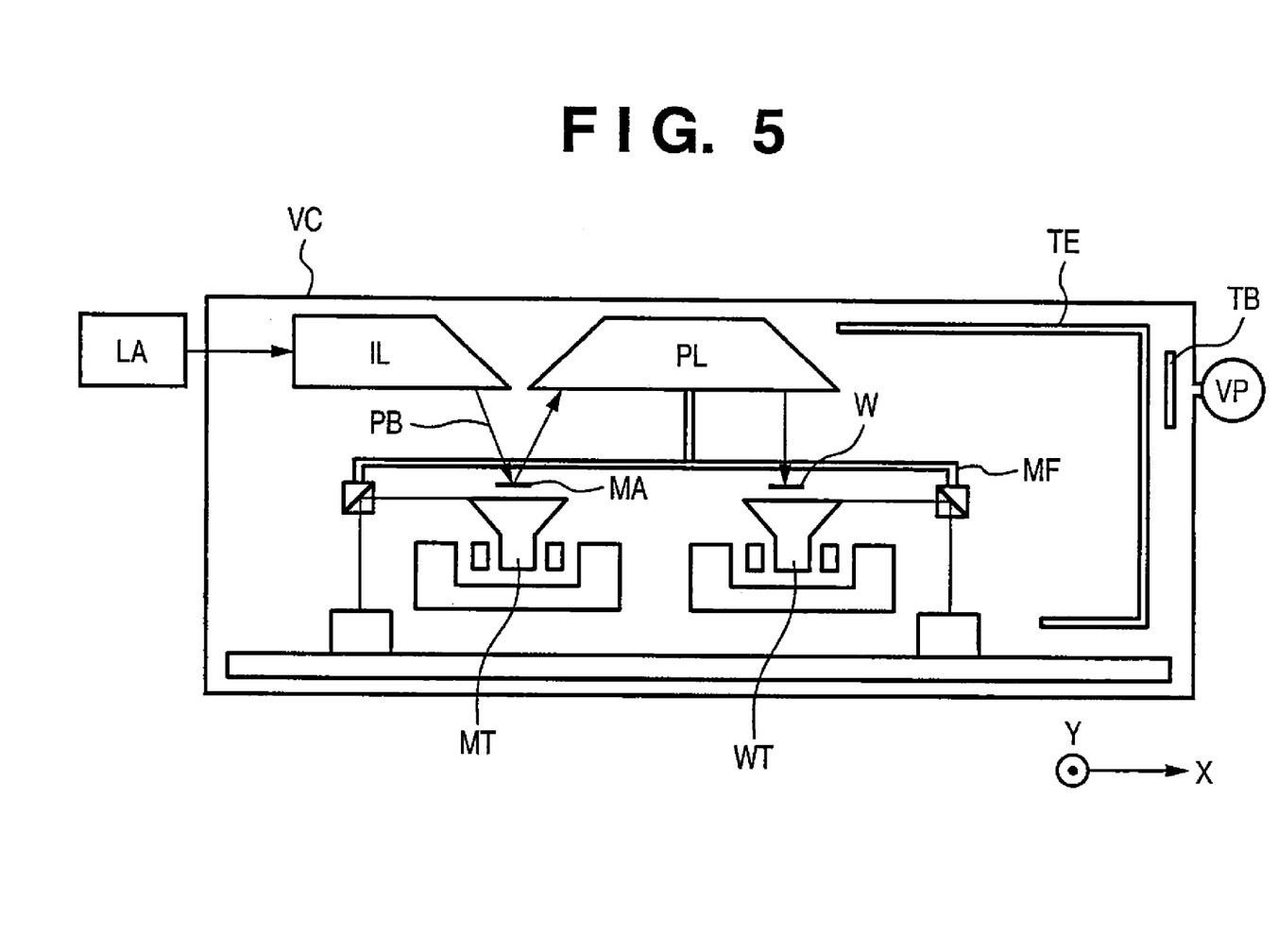
FIG. 5 is a view showing the overall configuration of an exposure apparatus according to a conventional example.

In FIG. 5, EUV light PB, which is emitted from a light source LA, is condensed on a mask MA through a radiation system IL, and is then condensed on a substrate W through a projection system PL. Reference characters MT and WT denote tables for scanning the mask MA and the substrate W, respectively.

These optical systems are housed in a vacuum chamber VC that has a vacuum pump VP, and are configured so that radiant heat of the vacuum pump VP is deflected by use of a heat deflector TB with a low coefficient of radiant heat, so that the heat does not affect the projection system PL, or the like. Further, the systems are configured so as to surround heat that is generated from the projection system PL or substrate table WT, or the like, with a plate TE with a high coefficient of radiant heat, which is a sealed member.

As described above, according to an exposure apparatus that requires a vacuum atmosphere, radiant heat from the vacuum pump VP is deflected with the plate TB, or the like, that has a low coefficient of radiant heat, and heat from other heat sources is absorbed with the plate TE, or the like, that has a high coefficient of radiant heat.

However, since it is difficult for the deflected heat or absorbed heat to be released to outside of the vacuum chamber VC, because of the vacuum atmosphere, the temperature inside the vacuum chamber VC rises. The low thermal expansion glass (Zerodur™) that is used inside the vacuum atmosphere is used at about a zero crossing temperature, as described above. Therefore, there is a problem that even if the temperature in the vacuum chamber VC is kept constant, the temperature around the glass rises above the zero crossing temperature, due to the influence of radiant heat from the vacuum pump VP, and the like, and the glass cannot be used in the ideal temperature environment.

SUMMARY OF THE INVENTION

The present invention was made in view of the above problems, and an object of the invention is to achieve a technique that can reduce aberration fluctuations caused by deformation of a mirror member caused by temperature changes.

In order to achieve the above object, according to the present invention, an exposure apparatus that exposes a pattern of an original onto a substrate, comprises:

an illumination optical system configured to emit illumination light that illuminates the original;

a projection optical system configured to project the pattern, which is illuminated by the illumination light, onto the substrate; and a vacuum chamber configured to house at least one of the illumination optical system and the projection optical system, wherein, in order to suppress temperature changes of at least one of the illumination optical system and the projection optical system, the exposure apparatus is provided with a heat absorber configured to absorb heat that is generated within the vacuum chamber and heat entering the vacuum chamber from outside.

According to the present invention, it is possible to suppress a rise in temperature caused by heat generated within a vacuum chamber or heat entering the vacuum chamber from outside, and to maintain a constant temperature within the vacuum chamber. It is thus possible to maintain the temperature of mirrors inside the vacuum chamber at a constant temperature (zero crossing temperature) and to reduce deformations of the mirror members. Further, aberration fluctuations caused by deformation of the mirror members due to temperature changes are also reduced.

Further features of the present invention will become apparent from the following description of exemplary embodiments (with reference to the attached drawings).

DESCRIPTION OF THE EMBODIMENTS

Hereafter, embodiments of the present invention are described in detail based on the attached drawings. The embodiments described below are examples for implementing the present invention, and should be suitably modified or changed in accordance with various conditions, and the configuration of an apparatus to which the present invention is to be applied. For example, in addition to EUV light, the present invention can utilize X-rays as a light source, and can also be applied to an exposure apparatus that exposes a monocrystal substrate for a semiconductor wafer or a glass substrate for a liquid crystal display (LCD), as well as a method of manufacturing a device.

First Embodiment

Figure 1A:
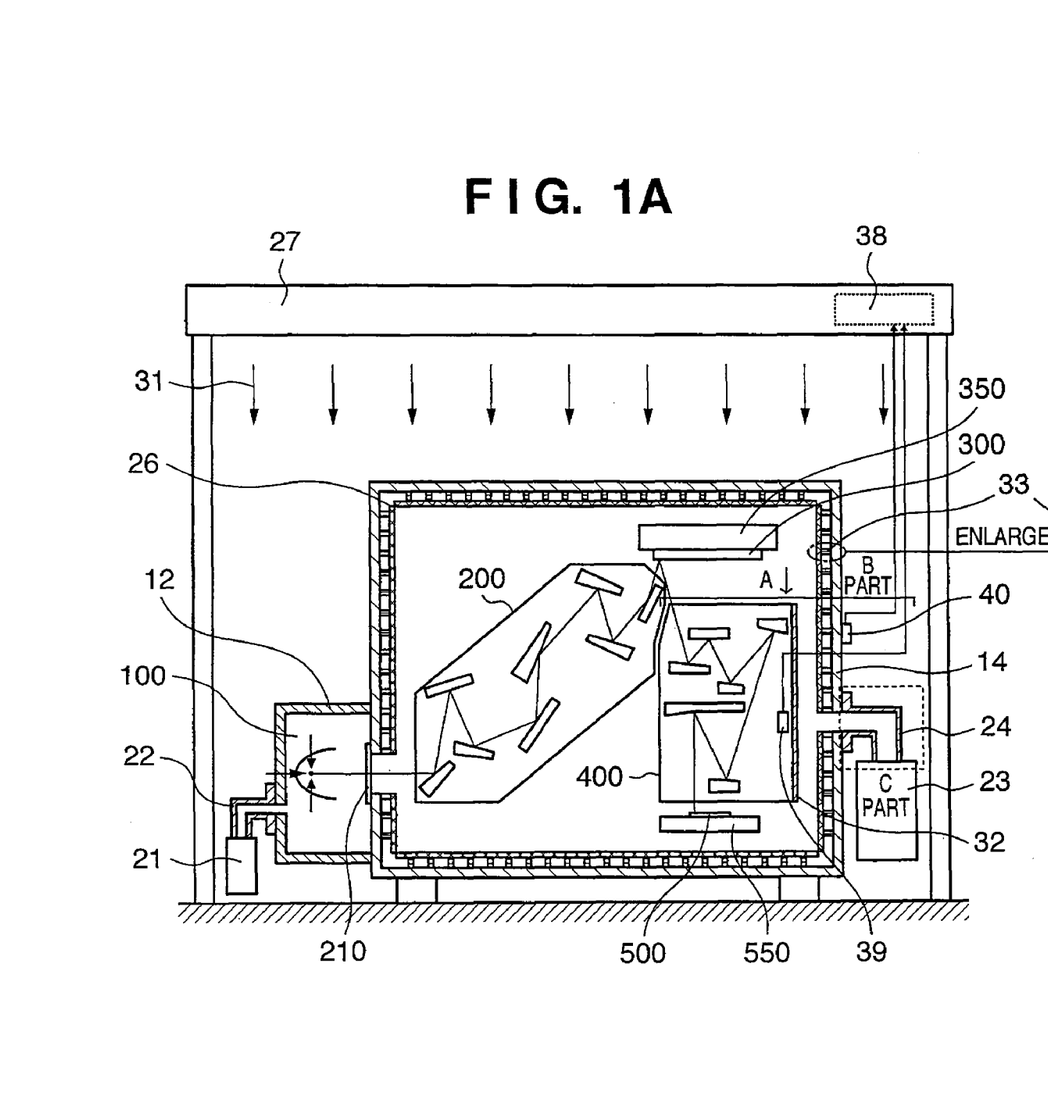
FIG. 1A is a side view that shows the overall configuration of an exposure apparatus according to a first embodiment of the present invention.
Figure 1B:
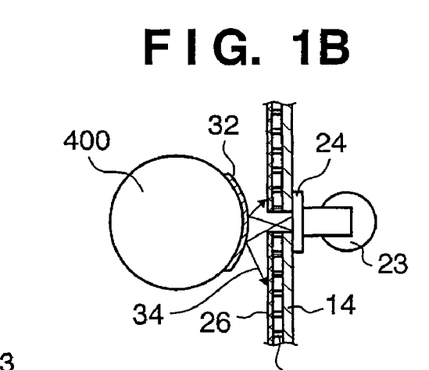
FIG. 1B is a view in the direction of the arrow A in FIG. 1A.
Figure 1C:
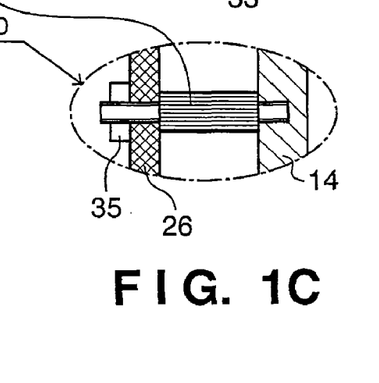
FIG. 1C is a detailed view of a B part shown in FIG. 1A.

FIG. 1A is a side view that shows the overall configuration of an exposure apparatus according to the first embodiment of the present invention, FIG. 1B is a view in the direction of the arrow A, and FIG. 1C is a detailed view of a B part.

In FIGS. 1A to 1C, reference numeral 100 denotes a light source, reference numeral 12 denotes a vacuum chamber that surrounds the light source 100, reference numeral 21 denotes a vacuum pump for making the inside of the vacuum chamber 12 into a vacuum atmosphere, and reference numeral 22 denotes a joint member that connects the vacuum chamber 12 and the vacuum pump 21.

Reference numeral 200 denotes an illumination optical system (barrel), reference numeral 400 denotes a projection optical system (barrel), reference numeral 350 denotes a mask stage that drives a mask 300, and reference numeral 550 denotes a wafer stage that drives an object for processing (wafer) 500. Further, reference numeral 14 denotes a vacuum chamber that surrounds each of the above-described constituents, reference numeral 23 denotes a vacuum pump for making the inside of the vacuum chamber 14 into a vacuum atmosphere, and reference numeral 24 denotes a joint member that connects the vacuum chamber 14 and the vacuum pump 23.

The light source 100, illumination optical system 200 and projection optical system 400 will now be described using FIG. 4.

Figure 4:
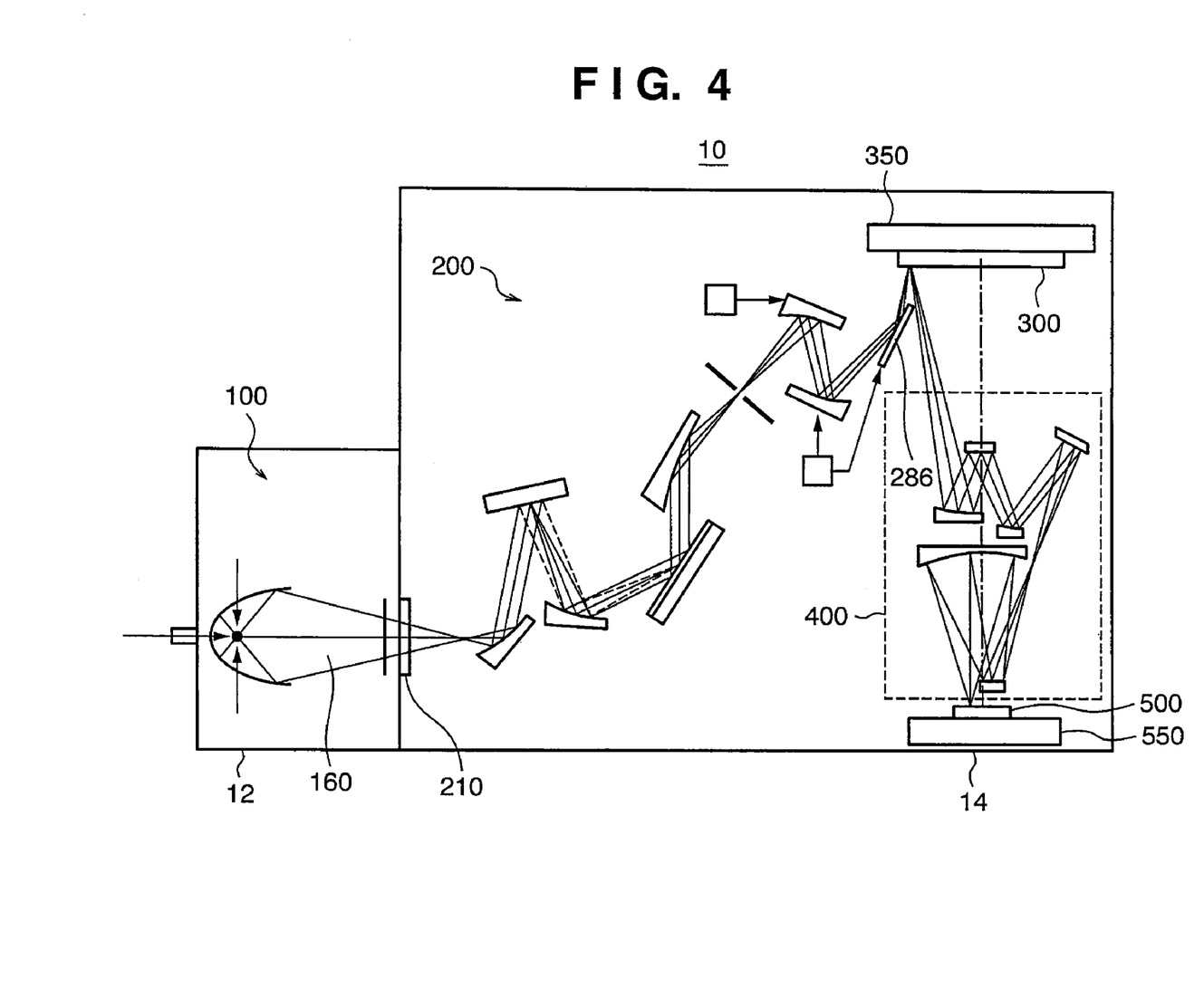
FIG. 4 is a view showing the detailed configuration of an optical system that is common to the embodiments shown in FIG. 1A to FIG. 3A.

In FIG. 4, an exposure apparatus 10 uses EUV light (for example, a wavelength of 13.4 nm) as illumination light for exposure to perform projection exposure according to a step and scan method, and includes a light source 100, an illumination optical system 200, a mask 300, a projection optical system 400 and an object for processing 500. The exposure apparatus 10 further includes a mask stage 350 on which a mask 300 is mounted, and a wafer stage 550 on which an object for processing 500 is mounted. The mask stage 350 and the wafer stage 550 are connected to a controller (not shown) and subjected to drive control.

EUV light flux 160 generated within the vacuum chamber 12 enters the vacuum chamber 14, in which the illumination optical system 200 and the projection optical system 400 are disposed through a window 210. Thereafter, the EUV light flux 160 is reflected by the group of mirrors of the illumination optical system 200, and is thrown upward by a mirror 286 and is incident on the mask 300. A pattern on the mask 300 is then formed on the object for processing (wafer) 500 through the projection optical system 400.

Returning to the description of FIGS. 1A to 1C, in the vicinity of the inner wall of the vacuum chamber 14, a heat absorbing plate 26 is disposed over the whole area, with the exception of the window 210, through which light from the light source 100 passes, and a portion in which the vacuum pump 23 is attached to the apparatus through the joint member 24. Further, the heat absorbing plate 26 is connected via the heat conductor 33 to the wall of the vacuum chamber 14 in a condition enabling heat exchange therebetween.

The above-described configuration is shown in detail in FIG. 1C. A male screw is, for example, inserted at both ends of the heat conductor 33, and one end is screwed into a female screw that is formed into a wall of the vacuum chamber 14, and the other end is fastened with a nut 35 after fitting the heat absorbing plate 26.

As a different configuration, a space between the heat absorbing plate 26 and the wall of the vacuum chamber 14 may be filled with a soft metal with a large coefficient of heat conductivity, such as indium, and the heat absorbing plate 26 may be fastened to the wall of the vacuum chamber 14 with a screw, or the like. The condition that the metal is soft is necessary in order to bring the heat absorbing plate 26 and the wall of the vacuum chamber 14 into close contact.

In addition to the above examples, another configuration may be applied, as long as the heat absorbing plate 26 is connected with the wall of the vacuum chamber 14 in a condition enabling heat exchange between the heat absorbing plate 26 and the wall of the vacuum chamber 14.

The conditions required for the heat absorbing plate 26 are that the coefficient of radiant heat of the surface facing the inside of the vacuum chamber 14 is large, and that the coefficient of heat conductivity of the base metal of the heat absorbing plate 26 is large. These conditions are fulfilled, for example, when copper (coefficient of heat conductivity: 403 W/m·K) or aluminum (coefficient of heat conductivity: 238 W/m·K) is employed as the base metal and thermal spraying with $Al_2O_3$ (alumina ceramics; coefficient of radiant heat: approximately 0.6) or a mixture of $Al_2O_3$ and $SiO_2$ (coefficient of radiant heat: approximately 0.85) is performed as surface treatment.

The condition required for the heat conductor 33 is that the coefficient of heat conductivity is large. This can be achieved, for example, by using copper (coefficient of heat conductivity: 403 W/m·K), aluminum (coefficient of heat conductivity: 238 W/m·K) or SiC (coefficient of heat conductivity: 150 W/m·K).

Further, it is better that the wall of the vacuum chamber 14 has a large coefficient of heat conductivity, and this can be achieved by using, for example, aluminum (coefficient of heat conductivity: 238 W/m·K).

The vacuum chamber 14 is disposed inside a temperature regulated chamber 27. An airflow 31 that is regulated to a constant temperature blows out from the temperature regulated chamber 27. The term "constant temperature" refers to, for example, a temperature at which the temperature inside the projection optical system 400 or the illumination optical system 200 becomes a zero crossing temperature. In this connection, instead of the above-described airflow 31, heat may also be removed using a different coolant (inert gas, etc.) that was regulated to a zero crossing temperature.

Inside the projection optical system (barrel) 400 is provided a barrel inner temperature sensor 39. The temperature information thereof is conveyed to a temperature controller 38 of a temperature regulated chamber that performs temperature control of the temperature regulated chamber 27. Then, for example, by decreasing the temperature of the airflow 31 blowing out from the temperature regulated chamber 27, when the temperature within the barrel that was detected by the barrel inner temperature sensor 39, is higher than the zero crossing temperature, the temperature inside the projection optical system (barrel) 400 can be made to be the zero crossing temperature.

Further, if the correlation between the temperature inside the projection optical system 400 and the temperature outside the vacuum chamber 14 can be known in advance, the detection temperature of a vacuum chamber wall temperature sensor 40 may be fed back to the temperature regulated chamber temperature controller 38, without feeding back the detection temperature of the barrel inner temperature sensor 39. Further, the temperature to serve as the basic information for feedback control may be the temperature from an unshown temperature sensor disposed inside the illumination optical system (barrel) 200, and not from the barrel inner temperature sensor 39.

Preferably, each mirror of the illumination optical system 200 and the projection optical system 400 disposed within the above-described vacuum chamber 14 is used in a constant temperature environment. The reason is that surface deformations are caused by temperature variations, and the size of such deformations change to cause aberration fluctuations. In particular, with respect to Zerodur™ (manufactured by SHOTT), which is a typical low thermal expansion glass, which has, among various mirrors, a high possibility of use with an EUV exposure apparatus, there is a temperature (zero crossing temperature) at which the coefficient of thermal expansion thereof becomes zero at around room temperature. Hence, since it is possible to make surface deformations zero (or to reduce surface deformations) by keeping the temperature constant at that temperature, it is extremely important to keep the temperature at the zero crossing temperature.

However, heat is generated by various factors within the vacuum chamber 14, and the temperature rises.

The first factors that may be considered are heat that is generated by the exposure light irradiated on the mirrors, and heat generated within the vacuum chamber 14 that is generated from the actuator for driving the mirrors, which is disposed within the illumination optical system 200 and the projection optical system 400, or from a sensor for determining mirror positions.

When these kinds of heat arise, they ultimately become radiant heat, and reach the heat absorbing plate 26 that is disposed in the vicinity of the inner wall of the vacuum chamber 14. That heat then reaches the outer wall of the vacuum chamber 14 through the heat conductor 33 and the wall of the vacuum chamber 14. Since the outer wall of the vacuum chamber 14 is exposed to the airflow 31, which is blowing out from the temperature regulated chamber 27, that heat is removed, and the temperature inside the vacuum chamber 14 is made constant by the airflow 31 that is regulated to a constant temperature.

The next factor that can be considered is heat from external equipment, such as the vacuum pump 23 that is attached to the vacuum chamber 14. As shown in FIG. 1B, in some cases, this heat 34 reaches the projection optical system 400, or the like, as radiant heat. Heat that reaches the optical system raises the temperature of mirrors disposed inside the projection optical system 400, and worsens the surface deformation.

In order to overcome this kind of problem, it is sufficient that at least one part of the external wall of the projection optical system 400 is covered with a heat reflection plate 32 that has a small coefficient of radiant heat (large reflectance ratio). By doing this, heat that has reached the projection optical system 400 is reflected by the heat reflection plate 32, and arrives at the heat absorbing plate 26. Since it becomes the same as heat generated internally thereafter, a description regarding the principles and effects, and the like, is omitted here.

It is important that the above-described heat reflection plate 32 is disposed at a portion that is effective with respect to radiant heat from outside, such as heat from the vacuum pump 23. Although, according to the present embodiment, the heat reflection plate 32 is provided near the projection optical system 400, when an effective location, based on the configuration of the entire exposure apparatus is the illumination optical system 200, it is sufficient that the heat reflection plate 32 is disposed at the outer wall of the illumination optical system 200 or at both the illumination optical system 200 and the projection optical system 400.

Further, the heat reflection plate 32 may be attached with a separate member to the barrel of the projection optical system 400, or the barrel itself of the projection optical system 400 may be constituted by a member having a small coefficient of radiant heat.

As described above, both heat generated within the vacuum chamber 14 and heat generated outside the vacuum chamber 14 ultimately reach the heat absorbing plate 26, arrive at the outer wall through the heat conductor 33 and the vacuum chamber 14, and are exposed to the airflow 31 from the temperature regulated chamber 27 that was regulated to a constant temperature. It is thus possible to constantly maintain the temperature inside the vacuum chamber 14 at the zero crossing temperature. Hence, it is possible to reduce, or bring to zero, aberration fluctuations caused by deformations in the mirror members caused by temperature changes.

Second Embodiment

Figure 2:
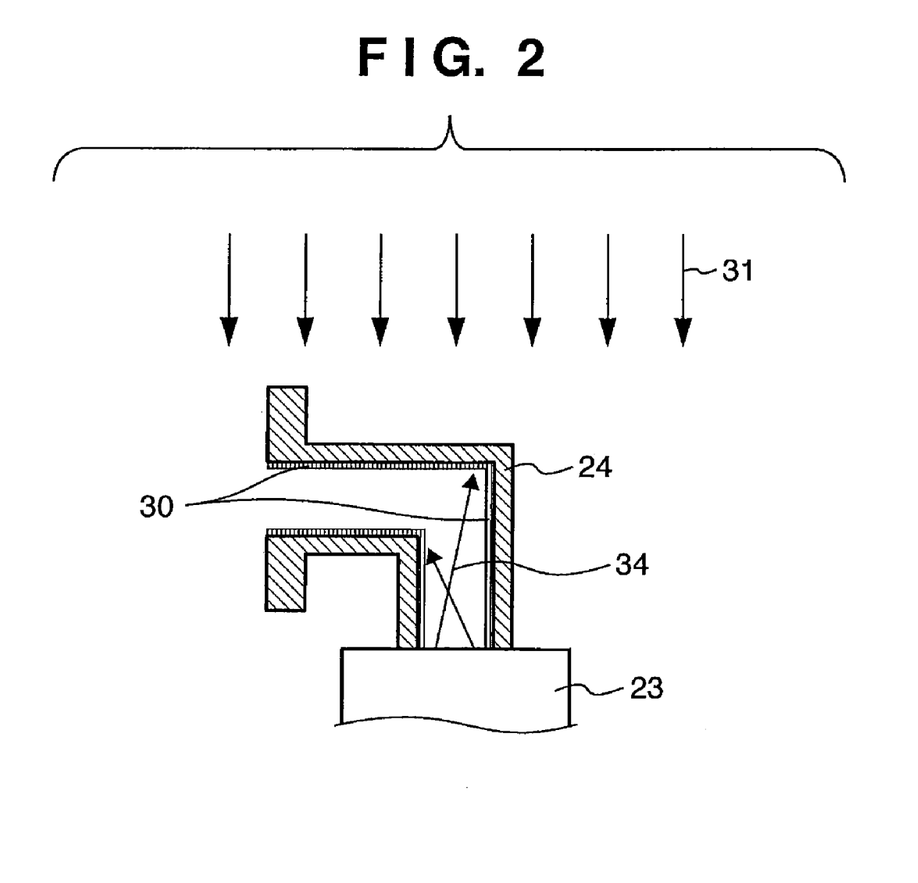
FIG. 2 is a view showing the details of a C part shown in FIG. 1A, as a second embodiment of this invention.

The second embodiment relates, in particular, to a configuration that effectively removes heat from the vacuum pump 23 that is generated outside the vacuum chamber 14.

FIG. 2 is a view showing in detail the C part of FIG. 1A as a second embodiment according to this invention.

In FIG. 2, a surface treatment layer 30 is formed on the inner wall of the joint member 24 that connects the vacuum pump 23 and the vacuum chamber 14. The condition required for the surface treatment layer 30 is that the coefficient of radiant heat is large. As described above, for the first embodiment also, this is achieved by thermal spraying with $Al_2O_3$ (alumina ceramics; coefficient of radiant heat: approximately 0.6) or a mixture of $Al_2O_3$ and $SiO_2$ (coefficient of radiant heat: approximately 0.85) is performed as surface treatment.

According to this kind of configuration, the heat 34, which is generated by the vacuum pump 23, is absorbed by the surface treatment layer 30 and arrives at the outer wall of the joint member 24, and is then cooled by the airflow 31 blowing from the temperature regulated chamber 27. Thus, penetration of the heat 34 into the vacuum chamber 14 is eliminated or reduced, and the effect of maintaining the temperature environment within the vacuum chamber 14 at the zero crossing temperature increases.

Although, according to the present embodiment, cooling of the joint member 24 was described as the airflow 31 blowing from the temperature regulated chamber 27, the heat 34 may also be removed by wrapping a cooling jacket around the joint member 24 and causing coolant to flow, which is regulated to the zero crossing temperature. Further, although a configuration was adopted in which the inner wall of the joint member 24 was covered with the surface treatment layer 30 having a large coefficient of radiant heat, a heat absorbing plate 26 may be disposed near the inner wall of the joint member 24 through the heat conductor 33, as shown in FIG. 1A.

Third Embodiment

Figure 3A:
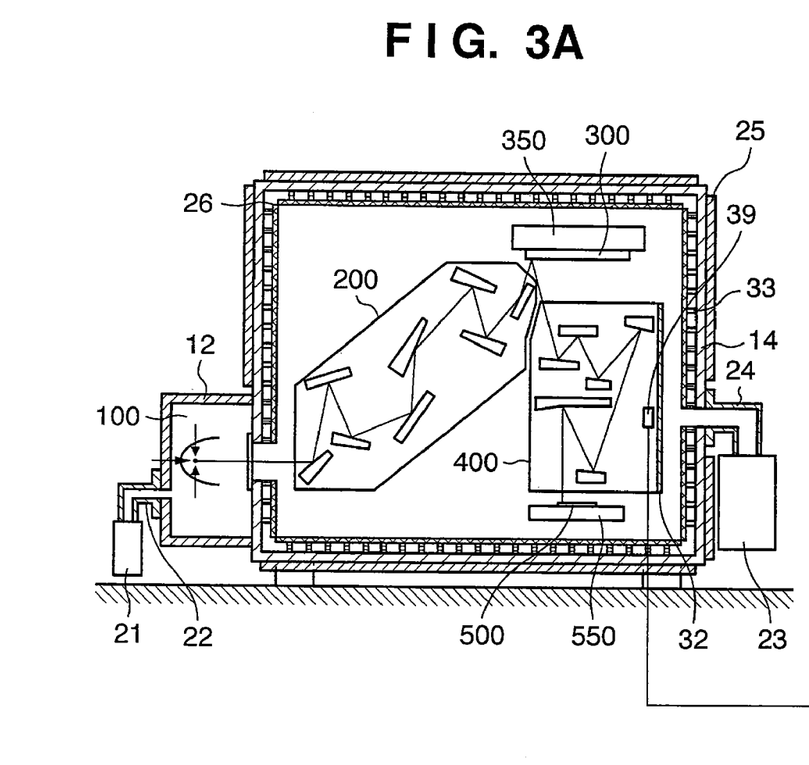
FIG. 3A is a side view that shows the overall configuration of an exposure apparatus according to a third embodiment of the present invention.

The third embodiment is different than the first embodiment in the respect that a cooling jacket 25, and not the airflow 31, is used to cool the vacuum chamber 14.

Figure 3B:
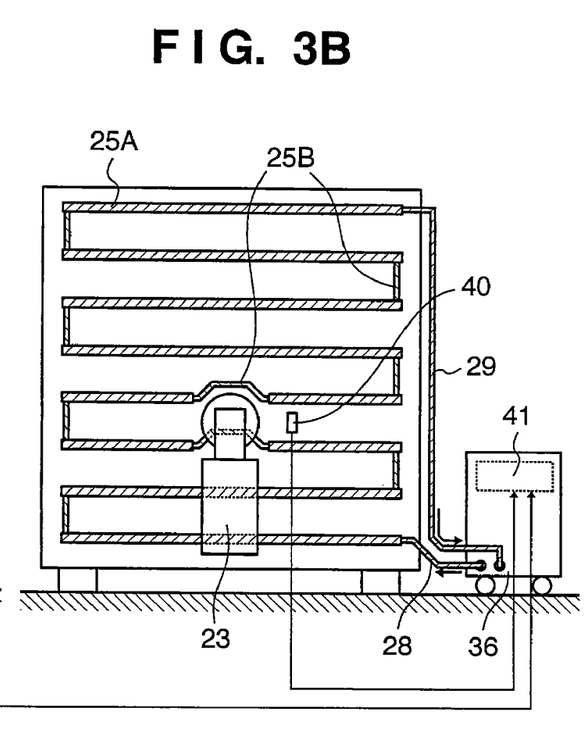
FIG. 3B is a view of a cooling jacket provided in a vacuum chamber.

FIG. 3A is a side view that shows the overall configuration of an exposure apparatus according to the third embodiment of this invention, and FIG. 3B is a view of a cooling jacket that is provided in the vacuum chamber. Hereafter, components that are the same as those in FIGS. 1A to 1C are denoted by the same symbols, and a description of these components is omitted.

As shown in FIGS. 3A to 3B, heat that was generated inside or outside the vacuum chamber 14 reaches a wall of the vacuum chamber 14 through the heat absorbing plate 26 and the heat conductor 33.

The outside of the vacuum chamber 14 is covered by a cooling jacket 25 that is attached thereto in a condition that enables heat exchange. Specifically, as shown in FIG. 3B, the cooling jacket 25 consists of a pipe 25A and a tube 25B, and coolant that was temperature controlled by a chiller 36 circulates therethrough. As a coolant, a fluid with a large thermal capacity, such as water, is best.

The purpose of the chiller 36 is to bring the inside of the illumination optical system 200 or the projection optical system 400 to the zero crossing temperature, by maintaining the coolant at a constant temperature, and to circulate the coolant by supplying it through a supply pipe 28 and recovering it through a recovery pipe 29.

A barrel inner temperature sensor 39 is disposed within the projection optical system (barrel) 400, and the temperature information thereof is conveyed to a chiller temperature controller 41 that controls the temperature of the chiller 36. Then, for example, by decreasing the temperature of the coolant flowing from the chiller 36, when the temperature within the barrel, which was detected by the barrel inner temperature sensor 39, is higher than the zero crossing temperature, the temperature inside the projection optical system (barrel) 400 can be brought to the zero crossing temperature.

Further, if the correlation between the temperature inside the projection optical system 400 and the temperature outside the vacuum chamber 14 can be known in advance, the detection temperature of the vacuum chamber wall temperature sensor 40 may be fed back, without feeding back the detection temperature of the barrel inner temperature sensor 39 to the chiller temperature controller 41.

Further, the temperature to serve as the basic information for feedback control may be the temperature from a temperature sensor (not shown) disposed inside the illumination optical system (barrel) 200, and not from the barrel inner temperature sensor 39 disposed within the projection optical system (barrel) 400.

As described above, both heat generated within the vacuum chamber 14 and heat generated outside the vacuum chamber 14 ultimately reach the heat absorbing plate 26, arrive at the outer wall through the heat conductor 33 and the vacuum chamber 14, and touch the cooling jacket 25, through which coolant from the chiller 36, which was regulated to a constant temperature, flows. It is thus possible to constantly maintain the temperature within the projection optical system (barrel) 400, or the temperature within the illumination optical system (barrel) 200, at the zero crossing temperature. Hence, it is possible to reduce or bring to zero aberration fluctuations caused by deformations of the mirror members caused by temperature changes.

[Device Manufacturing Method]

An embodiment of a device manufacturing method using the above described exposure apparatus will be described next.

Figure 6:
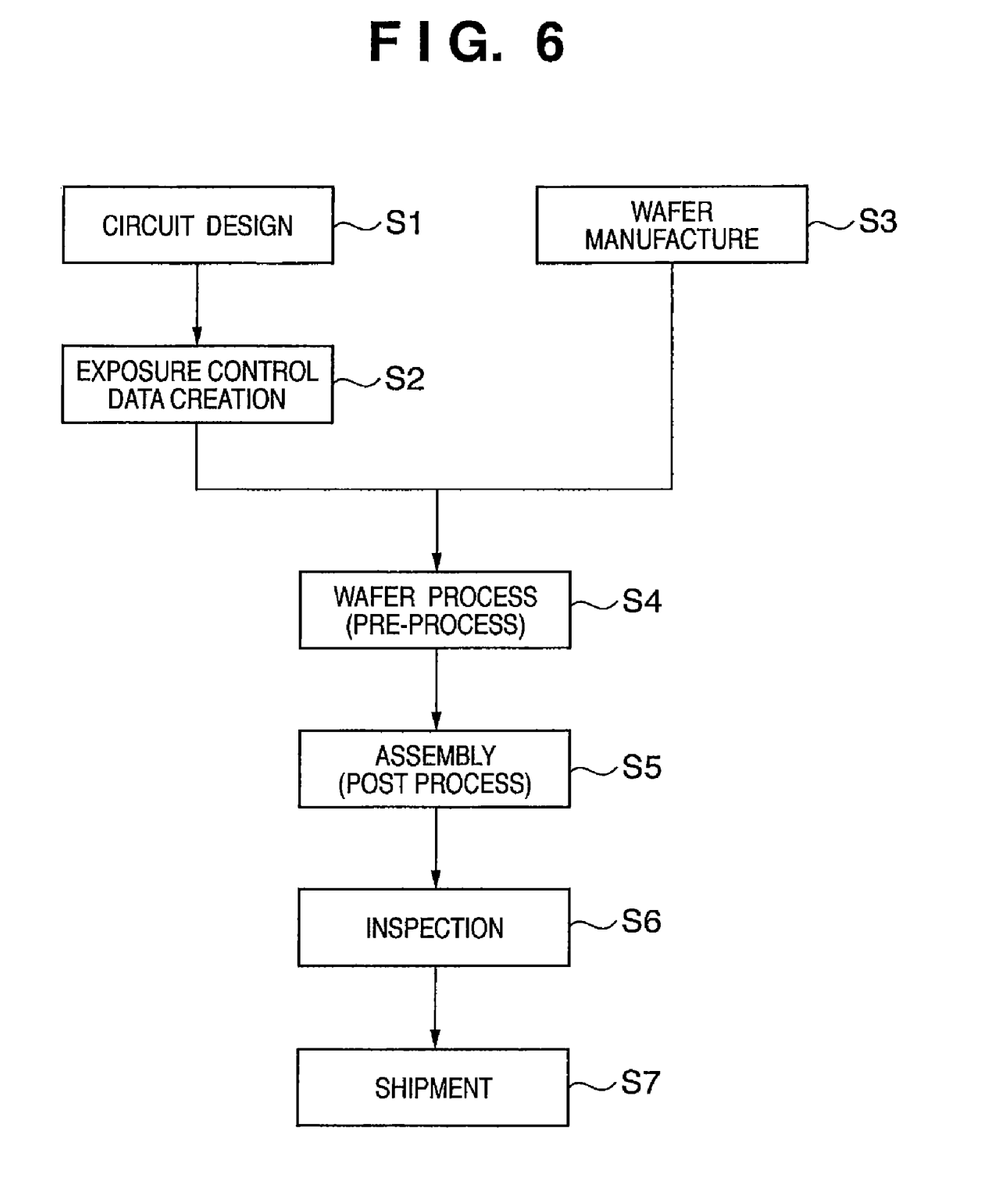
FIG. 6 is a view that illustrates the flow of manufacturing a micro-device.

FIG. 6 shows the flow of the manufacture of a micro-device (e.g., a semiconductor chip, such as an IC or LSI, a liquid crystal panel, a CCD, a thin-film magnetic head, or a micro-machine). In step S1 (circuit design), the circuit of a semiconductor device is designed. In step S2 (exposure control data creation), exposure control data of the exposure apparatus is created on the basis of the designed circuit pattern. In step S3 (wafer manufacture), a wafer is manufactured using a material, such as silicon. In step S4 (wafer process), called a pre-process, an actual circuit is formed on the wafer by lithography using the wafer and the exposure apparatus, which has received the prepared exposure control data. Step S5 (assembly), called a post-process, is the step of forming a semiconductor chip by using the wafer manufactured in step S4. This step includes processes such as assembly (dicing and bonding) and packaging (chip encapsulation). In step S6 (inspection), the semiconductor device manufactured in step S5 undergoes inspections, such as an operation confirmation test and a durability test. After these steps, the semiconductor device is completed and shipped (step S7).

Figure 7:
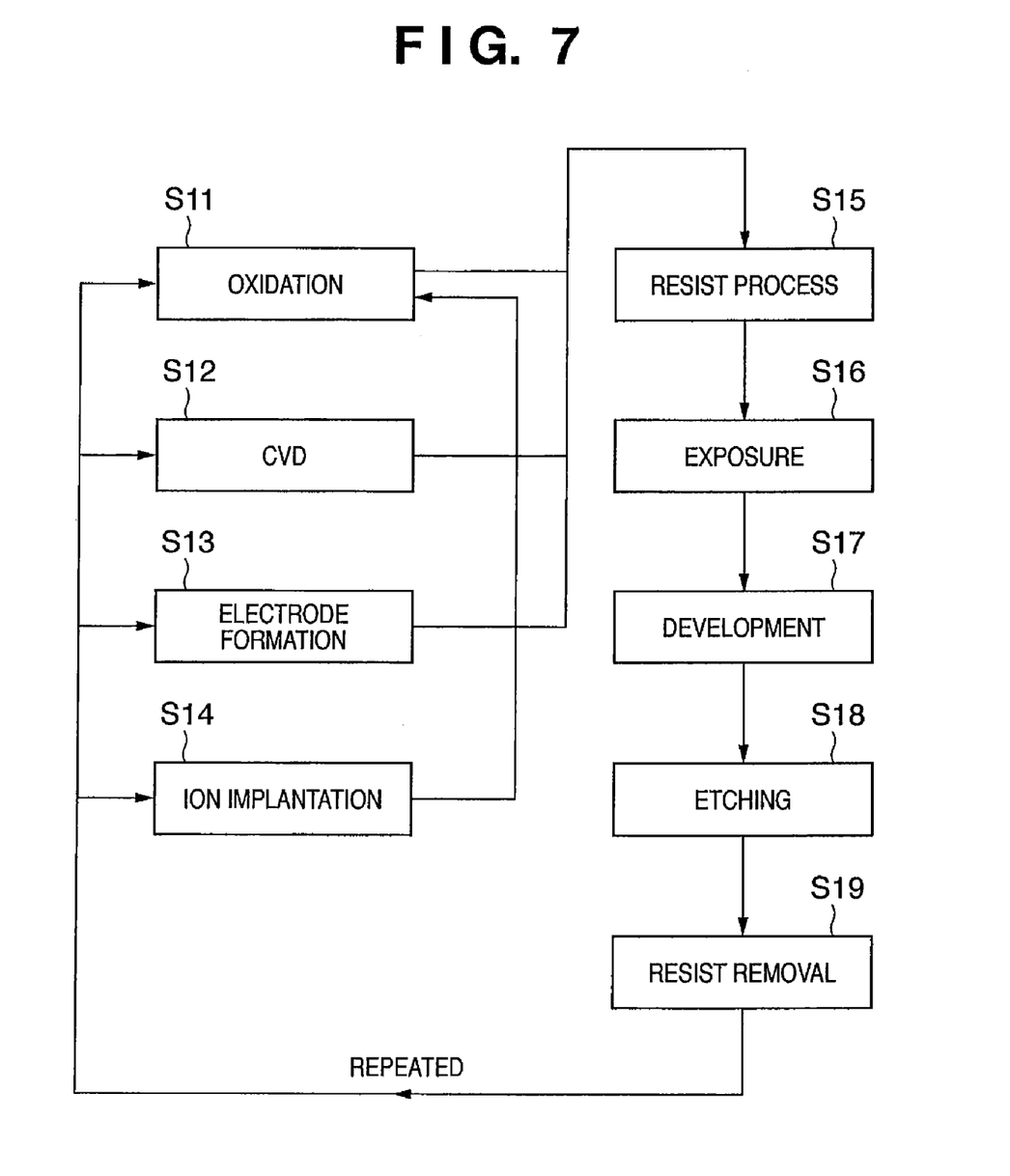
FIG. 7 is a view that illustrates a wafer process.

FIG. 7 shows the detailed flow of the wafer process. In step S11 (oxidation), the wafer surface is oxidized. In step S12 (CVD), an insulating film is formed on the wafer surface. In step S13 (electrode formation), an electrode is formed on the wafer by vapor deposition. In step S14 (ion implantation), ions are implanted in the wafer. In step S15 (resist process), a photosensitive agent is applied to the wafer. In step S16 (exposure), the circuit pattern is printed on the wafer by exposure using the above-described exposure apparatus. In step S17 (development), the exposed wafer is developed. In step S18 (etching), portions other than the developed resist image are etched. In step S19 (resist removal), any unnecessary resist remaining after etching is removed. These steps are repeated to form multiple circuit patterns on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An exposure apparatus that exposes a substrate to a pattern on an original, the apparatus comprising:
   an illumination optical system configured to illuminate the pattern on the original;
   a projection optical system configured to project the pattern on the original, which is illuminated by the illumination optical system, onto the substrate;
   a vacuum chamber configured to house at least one of the illumination optical system and the projection optical system;
   a heat absorbing plate disposed over an inner surface of a wall of the vacuum chamber and configured to absorb heat in the vacuum chamber;
   a heat conductor that includes a metal member that is softer than the heat absorbing plate and the wall of the vacuum chamber, and that fills a space between the heat absorbing plate and the wall of the vacuum chamber to bring the heat absorbing plate and the wall into close contact; and
   a cooler arranged outside the vacuum chamber and configured to cool the wall of the vacuum chamber.

2. The exposure apparatus according to claim 1, further comprising:
   a vacuum pump; and
   a joint member that connects the vacuum chamber and the vacuum pump,
   wherein the cooler is configured to cool the joint member.

3. An exposure apparatus according to claim 2, further comprising a heat absorber that is one of (i) connected to an inner surface of the joint member via a heat conductor, and (ii) on the inner surface, and that absorbs heat that is generated by the vacuum pump.

4. The apparatus according to claim 1, wherein the cooler is configured to cool the wall by using a coolant.

5. The apparatus according to claim 1, wherein the illumination optical system is configured to illuminate the pattern on the original with extreme ultraviolet light or X-rays, and the illumination optical system and the projection optical system include a mirror that reflects the extreme ultraviolet light or X-rays.

6. The apparatus according to claim 1, further comprising:
   a vacuum pump that is connected to the vacuum chamber; and
   a heat reflector arranged in the vacuum chamber and configured to reflect heat that is generated by the vacuum pump.

7. The apparatus according to claim 1, wherein the cooler is configured to cool the wall by using a flow of gas.

8. A method of manufacturing a device, the method comprising:
   exposing a substrate to a pattern on an original using the exposure apparatus defined in claim 1;
   developing the exposed substrate; and
   manufacturing the developed substrate to manufacture the device.

* * * * *